(12) United States Patent
Abe

(10) Patent No.: US 7,898,858 B2
(45) Date of Patent: Mar. 1, 2011

(54) MEMORY MODULE

(75) Inventor: Takashi Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 97 days.

(21) Appl. No.: 12/351,005

(22) Filed: Jan. 9, 2009

(65) Prior Publication Data

US 2009/0196101 A1 Aug. 6, 2009

(30) Foreign Application Priority Data

Jan. 31, 2008 (JP) .............................. 2008-020976

(51) Int. Cl.
*G11C 11/34* (2006.01)
(52) U.S. Cl. ................. 365/185.09; 365/51; 365/230.03
(58) Field of Classification Search ............ 365/189.05, 365/185.22, 185.05, 185.18, 230.06, 189.17, 365/185.23, 185.21
See application file for complete search history.

(56) References Cited

U.S. PATENT DOCUMENTS

| 2005/0182997 A1* | 8/2005 | Kushida et al. | ............. 714/763 |
| 2007/0028030 A1* | 2/2007 | Mahrla et al. | ............... 711/100 |
| 2009/0019325 A1* | 1/2009 | Miyamoto et al. | .......... 714/702 |

FOREIGN PATENT DOCUMENTS

| JP | 06-083716 | 3/1994 |
| JP | 09-288619 | 11/1997 |
| JP | 2002-163243 | 6/2002 |
| JP | 2002-279795 | 9/2002 |

* cited by examiner

*Primary Examiner*—Dang T Nguyen
(74) *Attorney, Agent, or Firm*—Young & Thompson

(57) ABSTRACT

The present invention provides a reliable memory module. The memory module including a plurality of memory devices arranged on a circuit board and controlled by an external memory controller includes a buffer having a function of detecting and correcting an error and a nonvolatile storage area that stores contents of the error.

11 Claims, 5 Drawing Sheets

| C | F | E |
|---|---|---|
| Low | Low | Low |
| Low | High | Low |
| High | Low | Low |
| High | High | High |

1

MEMORY MODULE

This application is based upon and claims the benefit of priority from Japanese patent application No. 2008-020976, filed on Jan. 31, 2008, the disclosure of which is incorporated herein in its entirety by reference.

BACKGROUND OF THE INVENTION

1. Field of the Invention

The present invention relates to a memory module.

2. Description of Related Art

As a memory device in a memory module used in a main memory (main storage) or the like of an information processing apparatus such as a server, a personal computer, or a workstation, a semiconductor is used. However, since the memory device is formed by a very microscopic circuit, a microscopic defect may occur in production of the memory device. A memory module on which the memory device having the defect is mounted is used in the information processing apparatus, a memory error may occur.

As memory errors, in addition to a hardware defect of the memory device, a software error occurring without any hardware problem, a problem of an interface, a compatibility problem, a contact failure of a socket, an erroneous operation on a memory controller, and the like are conceivable.

In an information processing apparatus which requires reliability of a server often has a function that detects and corrects errors up to a certain data bit rate. A data bit rate which can be corrected depends on the performance of a memory controller.

The error detection and correction are performed by the memory controller, occurring errors cannot be easily classified into errors caused by a problem on the memory module and errors caused by a problem on the other parts. In a system using a plurality of memory modules, a memory module in which a drawback occurs cannot be easily discriminated from other memory modules. A problem of poor reproducibility or a problem that the same drawback cannot be reproduced are also posed, a position where a drawback occurs is often hard to be specified.

For this reason, schemes that detect, correct, and record errors on a memory module are desired.

FIG. 9 is a schematic view of a memory system according to the present invention.

In FIG. 9, reference numeral 1 denotes a memory device; and 2 denotes a circuit board. A memory device 1 is mounted on the circuit board 2 to form a memory module.

Reference numeral 3 denotes a memory controller, and an arrow means transmission of a data signal. In this case, FIG. 9 shows a case in which transmission of a data signal between a memory device and a memory controller is directly performed. The number of data signals, a signal except for the data signal, parts such as a device and a connector related to the signal except for the data signal are omitted.

In the memory system shown in FIG. 9, functions of detecting, correcting, and recording an error are not present in a memory module.

An example of a technique related to a memory module is described in Patent Documents 1 to 4.

In a microcomputer of Patent Document 1 (Japanese Patent Application Laid-Open (JP-A) No. 2002-163243) which includes a flash memory with error detecting/correcting function in which a control program for device-embedded control and control data are input and written from the outside in units of words, and a CPU (Central Processing Unit) that reads the control program and the control data from the flash memory with error detecting/correcting function to execute or output the control program and the control data, the flash memory with error detecting/correcting function selects a plurality of bytes from a word of an external input by external control, writes the bytes, reads the bytes under the control of the CPU, performs error detection and correction in units of bytes, and outputs the bytes.

According to the microcomputer, when a data length of 1 byte is sufficient for the control data, since securement and access of a data area for the control data in units of bytes are performed every bytes per word in units of bytes, a data area reduces to one severalth a data area of a conventional microcomputer, and an unused area in the data area considerably reduces. As a result, a flash memory with error detecting/correcting function is effectively used.

A memory device of Patent Document 2 (JP-A No. 2002-279795) which responds to a command signal, includes: a plurality of banks each configured by a memory array configured to include spare units of a plurality of main storage cells and a plurality of spare storage cells; a detector to detect an error of a unit of a first main storage cell in a first bank; and a controller that responds to a command signal to automatically re-map the first unit of the main storage cell on the spare storage cell of the first unit.

According to the memory device, a memory device which responds to a command signal includes a plurality of banks of a memory array. Each of the banks includes a plurality of main storage cells and spare units of spare storage cells. The detector detects an error in the unit of the first main storage cell of the first bank. The controller automatically re-maps the unit of the first main storage cell on a unit of a second storage cell in response to a command signal without interrupting access to memory data. As a result, a self-recovering memory which is free from a drawback such as an uncorrectable hardware error in an existing memory scheme and does not require an additional memory module for a spare memory can be provided.

An electric rewritable nonvolatile memory in Patent Document 3 (JP-A No. 6-83716) which mixes high-rewriting-frequency data having a high rewriting frequency and low-rewriting-frequency data having a low rewriting frequency with each other and stores the data, includes: a data identifying unit that identifies data to be written as the high-rewriting-frequency data or the low-rewriting-frequency data; and a data write control unit that writes the data to be written in the memory cell by a predetermined highly reliable method when the data to be written is the high-rewriting-frequency data as a result of the identification of the data identifying unit and that writes the data in the memory cell by a normal method when the data to be written is the low-rewriting-frequency data.

According to the electrically rewritable nonvolatile memory, when the high-rewriting-frequency data and the low-rewriting-frequency data are mixed and stored in the electrically rewritable nonvolatile memory, data is written by a method depending on the rewriting frequencies of the data. For this reason, writing and reading processes having excessive reliability for the low-rewriting-frequency data need not be performed due to the presence of a small number of high-rewriting-frequency data, and a small memory capacity may be advantageously used.

In a main storage apparatus according to Patent Document 4 (JP-A No. 9-288619) which is controlled by a main storage control apparatus including an ECC (Error Correcting Code) circuit built therein and which performs data error detection and correction by using the ECC circuit, a dual-type memory cell is used, an error check unit that is connected to the memory cell and checks an error of data and a selecting unit that selects output data from the memory cell are added, and data is selected by a check result of the error check unit.

According to the main storage apparatus, the main storage control apparatus including the existing ECC circuit built therein is diverted without being changed, and a dualized memory cells are equivalently handled, so that an inexpensive reliable main storage apparatus which, even an error having two bits or more is detected in one memory cell, can continue a process by using other can be provided.

However, in the techniques described in Patent Documents 1 to 4, detection of an error is not performed on the memory module, and error detection accuracy has room for improvement.

SUMMARY

The present invention has been made in consideration of the above circumstances and its exemplary object is to provide a reliable memory module.

In order to achieve the above object, the present invention has the following characteristics.

<Memory Module>

A first apparatus according to the present invention is a memory module including a plurality of memory devices arranged on a circuit board and controlled by an external memory controller, including: a buffer having a function of detecting and correcting an error; and a nonvolatile storage area that stores contents of the error.

A second apparatus according to the present invention is a memory module including a plurality of memory devices arranged on a circuit board and controlled by an external memory controller, including: a buffer having a function of detecting and correcting an error; a nonvolatile storage area that stores contents of the error; and L memory banks (L is a natural number of 2 or more), each configured by one pair of memory devices and a memory device selecting circuit that is connected to the one pair of memory devices, simultaneously transmits the same data to the one pair of memory devices, transmits data from one memory device to the buffer when an error does not occur during reading of the data, and switches the data to data from the other memory device when the error occurs.

A third apparatus according to the present invention is a memory module including a plurality of memory devices arranged on a circuit board and controlled by an external memory controller, including: M (M is a natural number of 2 or more) memory banks, each configured by N (N is a natural number of 3 or more) memory devices and an N-multiplexed buffer that is connected to an external memory controller, simultaneously transmits the same data to the N memory devices, and performs a majority decision in units of bits during reading of the data to transmit a major value to the memory controller; an error receiving buffer that receives error position information transmitted from the memory bank when the memory bank has a difference between the data; and a nonvolatile storage area that is connected to the error receiving buffer and stores contents of the error.

EXEMPLARY EMBODIMENT

Figure 1:
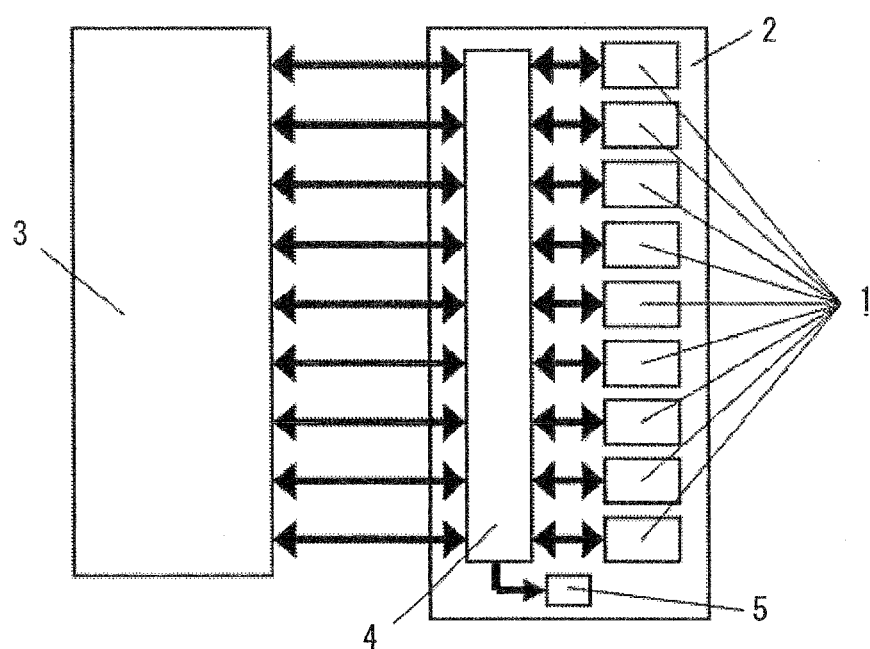
FIG. 1 is a block diagram showing a first exemplary embodiment of a memory system using a memory module according to the present invention.

In general, detection and correction for a memory error are performed by a memory controller. A buffer is mounted on a memory module to give an error detecting/correcting function to the buffer. Detected error contents are to be recorded on a nonvolatile storage area mounted on the memory module. Depending on the contents of the nonvolatile storage area, it can be determined whether a defect occurs on a memory module. When the system must be notified of an error, data is transmitted to the memory controller without intentionally correcting the error, or error notification is performed by using a bus different from a bus for data transmission. According to these methods, a memory error occurring in the memory module can be recorded on the memory module, a classifying operation or an analyzing operation in occurrence of a memory error can be easily performed.

A memory module according to an exemplary embodiment of the present invention is a memory module including a plurality of memory devices arranged on a circuit board and controlled by an external memory controller, including: a buffer having a function of detecting and correcting an error; and a nonvolatile storage area that stores contents of the error.

According to the above configuration, since the memory module includes the buffer having the function of detecting and correcting an error and the nonvolatile storage area that stores the contents of the error, the error is detected and corrected on the memory module, the contents of the error are stored to make it possible to classify an occurring error into an error on the memory module or another error, defects can be classified by memory modules in a system using a plurality of memory modules, and provision of a reliable memory module can be realized.

A memory module according to another exemplary embodiment of the present invention is a memory module including a plurality of memory devices arranged on a circuit board and controlled by an external memory controller, including: a buffer having a function of detecting and correcting an error; a nonvolatile storage area that stores contents of the error; and L (L is a natural number of 2 or more) memory banks, each configured by one pair of memory devices and a memory device selecting circuit that is connected to the one pair of memory devices, simultaneously transmits the same data to the one pair of memory devices, transmits data from one memory device to the buffer when an error does not occur during reading of the data, and switches the data to data from the other memory device when the error occurs.

According to the above configuration, the error is detected and corrected on the memory module, the contents of the error are stored to make it possible to classify an occurring error into an error on the memory module or another error, defects can be classified by memory modules in a system using a plurality of memory modules, and provision of a reliable memory module can be realized.

A memory module according to still another exemplary embodiment of the present invention is a memory module including a plurality of memory devices arranged on a circuit board and controlled by an external memory controller, including: M (M is a natural number of 2 or more) memory banks, each configured by N (N is a natural number of 3 or more) memory devices and an N-multipiexed buffer that is connected to an external memory controller, simultaneously transmits the same data to the N memory devices, and performs a majority decision in units of bits during reading of the data to transmit a major value to the memory controller; an error receiving buffer that receives error position information transmitted from the memory bank when the memory bank has a difference between the data; and a nonvolatile storage area that is connected to the error receiving buffer and stores contents of the error.

According to the above configuration, the error is detected and corrected on the memory module, the contents of the error are stored to make it possible to classify an occurring error into an error on the memory module or another error, defects can be classified by memory modules in a system using a plurality of memory modules, and provision of a reliable memory module can be realized.

A memory module according to still another exemplary embodiment of the present invention is a memory module wherein, in addition to the above configuration, the buffer includes a memory-controller-side driver receiver circuit that exchanges a signal with the memory controller; a memory-device-side driver receiver circuit that exchanges a signal with the memory device; an error detecting/correcting circuit that is connected to the memory-controller-side driver receiver circuit and the memory-device-side driver receiver circuit and detects and corrects an error; and an error correction designating circuit that designates the error detecting/correcting circuit to perform error correction.

A memory module according to still another exemplary embodiment of the present invention is a memory module wherein, in addition to the above configuration, the error detecting/correcting circuit includes an error detecting circuit; an error correcting switch including an input terminal connected to an output terminal of the error detecting circuit; and an error correcting circuit including an input terminal connected to an output terminal of the error correcting switch and configured by a plurality of 2-input exclusive OR gates.

A memory module according to still another exemplary embodiment of the present invention is a memory module wherein, in addition to the above configuration, the error correcting switch includes a plurality of cells each configured by a plurality of 2-input AND gates that includes one input terminals connected to a common terminal, the other input terminals connected to a first input terminal, and an output terminal connected to a first output terminal and a jumper line that connects a second input terminal and a second output terminal to each other.

The above embodiments exemplify preferred embodiments of the present invention. The present invention is not limited to the embodiments, and various modifications of the invention can be effected without departing from the spirit and scope of the invention.

Exemplary embodiments of a memory module according to the present invention will be described below with reference to the accompanying drawings.

First Exemplary Embodiment

FIG. 1 is a block diagram showing a first exemplary embodiment of a memory system using a memory module according to the present invention.

The memory system shown in FIG. 1 is a memory system that uses a memory module with error detecting/correcting function. Reference numeral 1 denotes a memory device; 2 denotes a circuit board; 3 denotes a memory controller; 4 denotes a buffer that detects and corrects a memory error; and 5 denotes a nonvolatile storage area to record a memory error.

The memory device 1, the buffer 4, and the nonvolatile storage area 5 are mounted on the circuit board 2 to form a memory module with error detecting/correcting function. In this case, the number of signals, signals and devices which are not related to signals except for a data signal and an error recording signal and components such as connectors are omitted. An arrow means transmission of a signal.

A signal driven by the memory device 1 is temporarily input to the buffer 4 and subjected to error check. When an error is not detected, data is directly transmitted to the memory controller 3. When the buffer 4 detects an error, error contents are recorded on the nonvolatile storage area 5. When error correction is necessary, the error is detected, and the data is transmitted to the memory controller 3. The error detection and correction in the buffer 4 use a method that makes it possible to perform error correction and error detection by causing the data to have a bit width larger than a data bit rate such as an ECC to be transmitted. A signal driven by the memory controller 3 passes through the buffer 4, and is directly transmitted to the memory device 1.

Configuration of First Exemplary Embodiment

Figure 2:
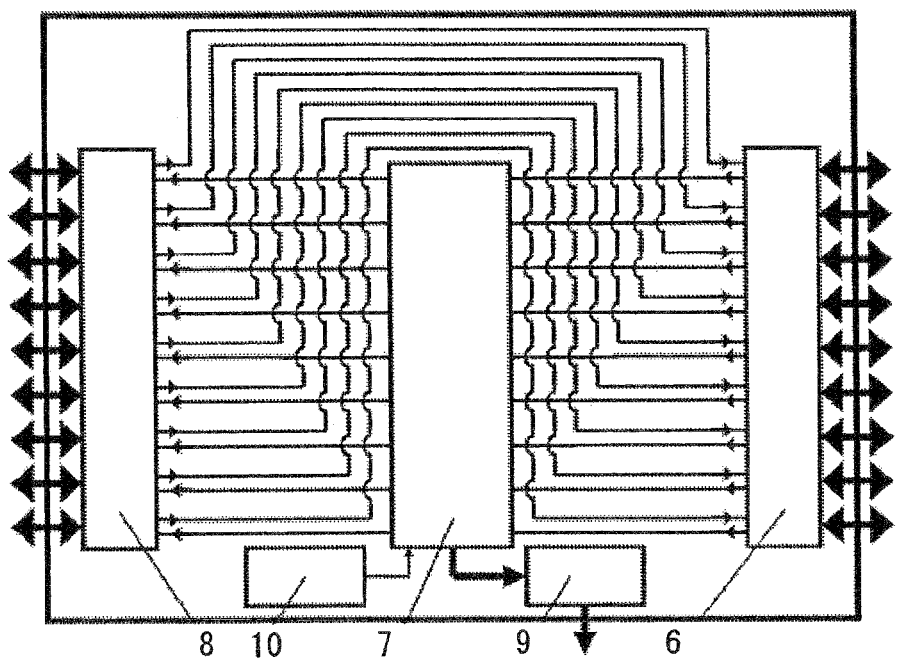
FIG. 2 is a diagram of a circuit in a buffer that detects and corrects a memory error shown in FIG. 1.

FIG. 2 is a diagram of a circuit in a buffer that detects and corrects a memory error shown in FIG. 1.

In FIG. 2, drive receiver 6 denotes a driver receiver circuit of a memory device 1 side; 7 denotes an error detecting/correcting circuit; 8 denotes a driver receiver circuit of the memory controller 3 side (see FIG. 1); 9 denotes a transmitting circuit that receives error information to transmit the error information to the nonvolatile storage area 5 (see FIG. 1); and 10 denotes an error correction designating circuit that designates error detection. In this case, the number of data signals and an external control signal are omitted. An arrow means transmission of a signal.

More specifically, the memory module is a memory module including a plurality of memory devices 1 arranged on the circuit board 2 and controlled by the external memory controller 3, including: the buffer 4 having a function of detecting/correcting an error; and the nonvolatile storage area 5 that stores contents of the error.

Figures 3, 4:
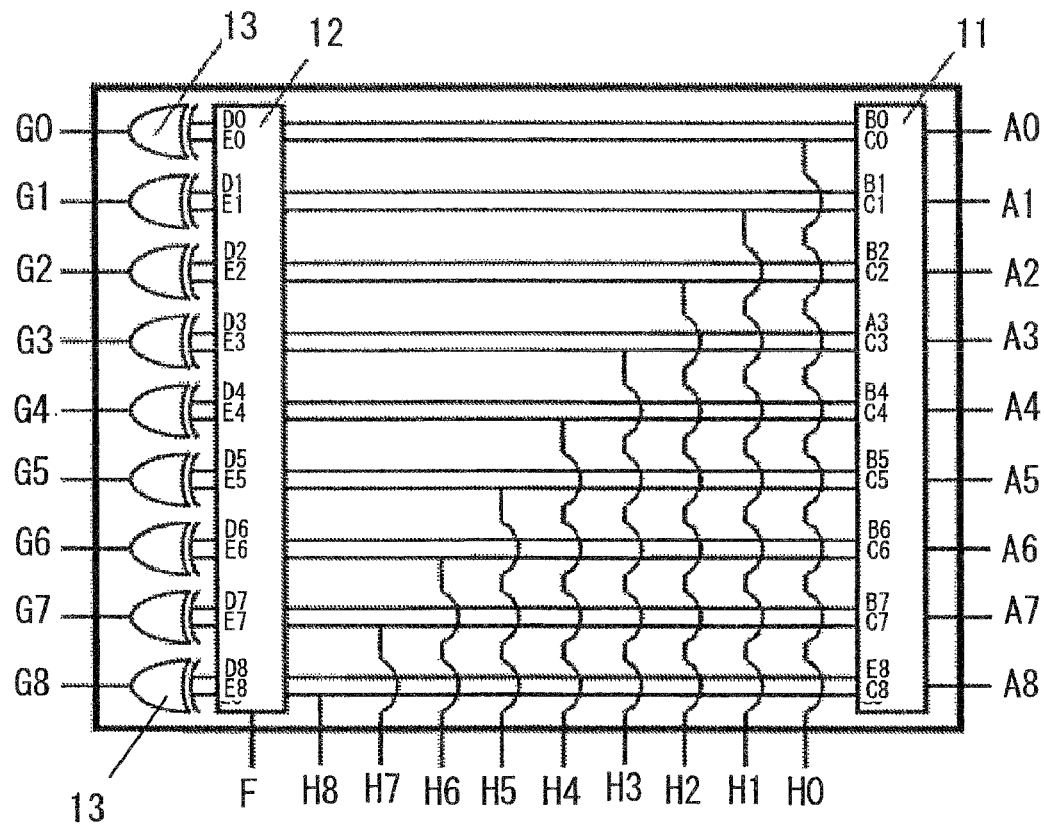
FIG. 3 is a diagram of one example of a circuit in an error detecting/correcting circuit 7 shown in FIG. 2.
FIG. 4 is a truth table of each XOR 13 in the error correcting circuit shown in FIG. 3.

FIG. 3 is a diagram of one example of a circuit in the error detecting/correcting circuit 7 shown in FIG. 2.

In FIG. 3, reference numeral 11 denotes an error detecting circuit; 12 denotes an error correcting switch; 13 denotes an error correcting circuit (XOR: exclusive OR). The number of data signals is omitted here.

Reference symbols A0 to A8 denote signals transmitted from the driver receiver circuit 6 (see FIG. 2) on the memory device. The signals are input to the error detecting circuit 11 to check the presence/absence of an error. When an error detected by the error detecting circuit 11, signals C0 to C8 corresponding to bits where the error occurs go to High. For example, when the signal A2 has an error, the signal C2 goes to High. When there is no error, the signals C0 to C8 are at Low. The signals A0 to A8 are directly output as B0 to B8 in FIG. 3, respectively.

The signals C0 to C8 output from the error detecting circuit 11 are transmitted as signals H0 to H8 to the transmitting circuit 9 (see FIG. 2), which receives error information to transmit the error information to the nonvolatile storage area 6. The signals B0 to B8 and the signals C0 to C8 are input to the error correcting switch 12. The signals B0 to B8 are directly output as D0 to D8, and the signals C0 to C8 are directly output as E0 to E8, respectively, when a signal F is at High. When the signal F is at Low, the signals E0 to E8 go to Low. Reference symbol F denotes a signal from the error correction designating circuit 10 (see FIG. 2), which designates error correction. The signals D and E are input to an XOR of the error correcting circuit 13, and outputs G0 to G8 are transmitted to the driver receiver circuit 8 (see FIG. 2) on the memory controller.

FIG. 4 is a truth table of each XOR 13 of the error correcting circuit shown in FIG. 3.

In FIG. 4, when the signal E is at Low, the value of the signal D is directly output as G. When the signal E at High, an inverted signal of the signal D is output as G. For example, in FIG. 3, the signal E1 is at Low, the value of the signal D1 directly serves as a signal G1. When the signal E1 is at High and the signal D1 is at High, the signal G1 goes to Low. When the signal E1 is at High and the signal D1 is at Low, the signal G1 goes to High.

Figure 5:
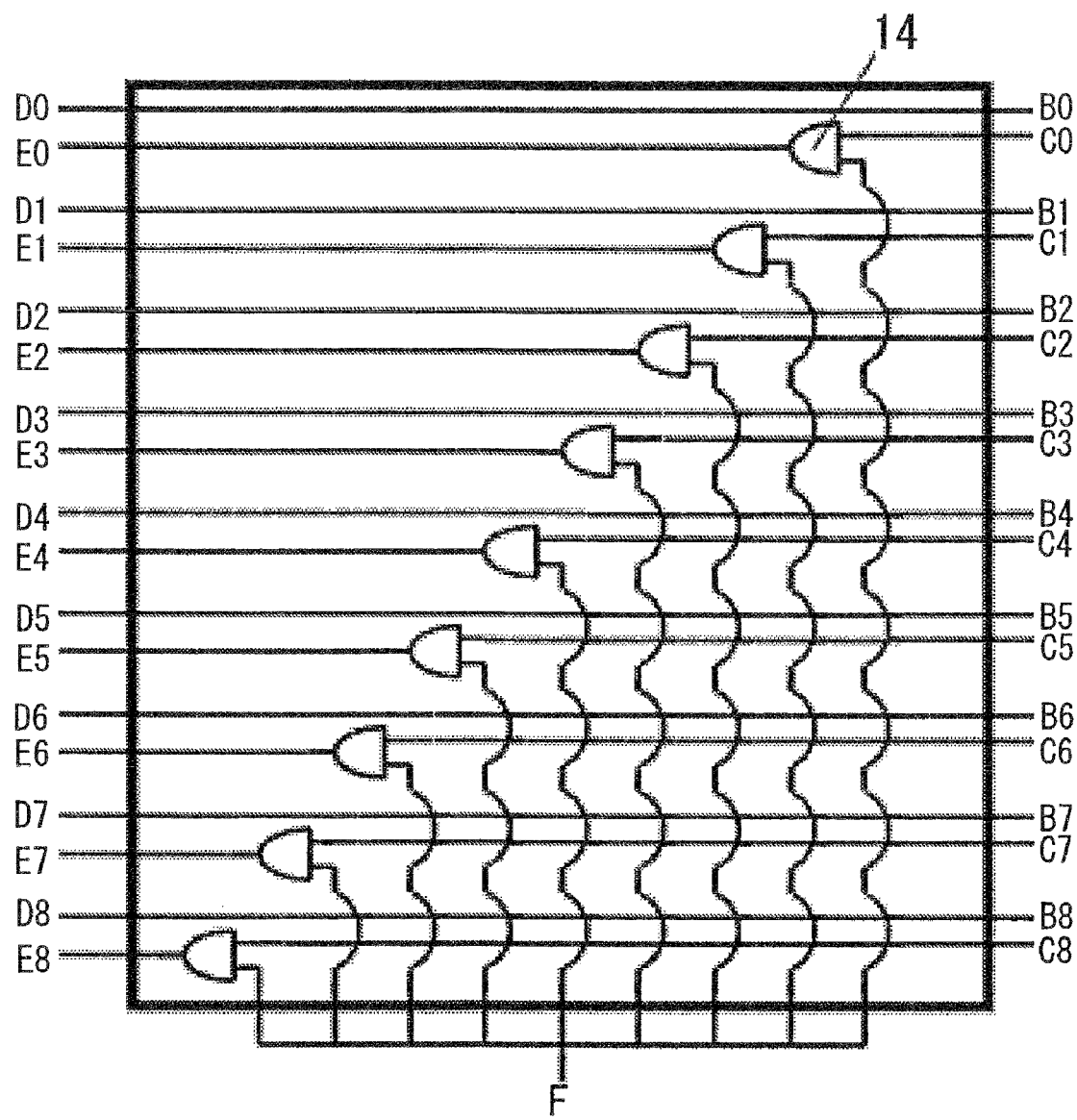
FIG. 5 is a diagram of one example of a circuit of an error correcting switch 12 shown in FIG. 3.

FIG. 5 is one example of a circuit of the error correcting switch 12 shown in FIG. 3.

Symbols B0 to B8, symbols C0 to C8, symbols D0 to D8, symbols E0 to E8, and a symbol F are correspond to the symbols in FIG. 2, respectively. The signals B0 to B8 are directly output as D0 to D8. Reference numeral 14 denotes an AND circuit (2-input AND gate).

Figures 6, 7:
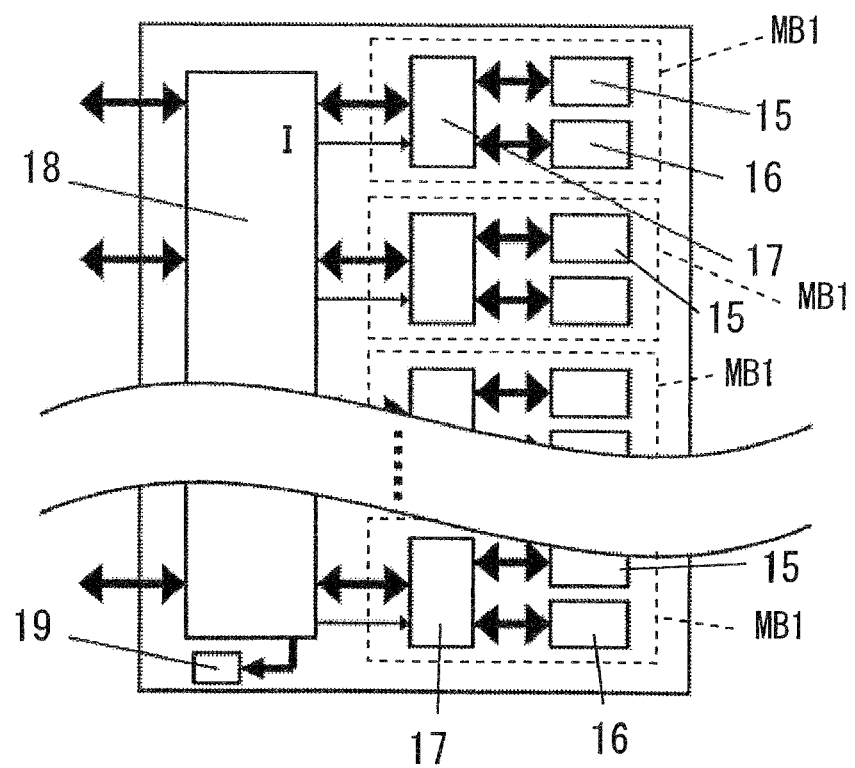
FIG. 6 is a truth table of an AND circuit 14 shown in FIG. 5.
FIG. 7 is a block diagram of one example showing a second exemplary embodiment of a memory module according to the present invention.

FIG. 6 is a truth table of the AND circuit 14 shown in FIG. 5.

In FIG. 6, when the signal F is at High, the signal C is directly output as the signal E. When the signal F is at Low, the signal E goes to low regardless of the signal C. For example, in FIG. 5, when the signals F and C1 are at High, the signal E1 goes to High. When the signals F is at High and C1 is at Low, the signal E1 goes to Low. When the signal F is at Low, the signal E1 goes to Low regardless of the value of the signal C1.

Explanation of Operation of First Exemplary Embodiment

Figure 9:
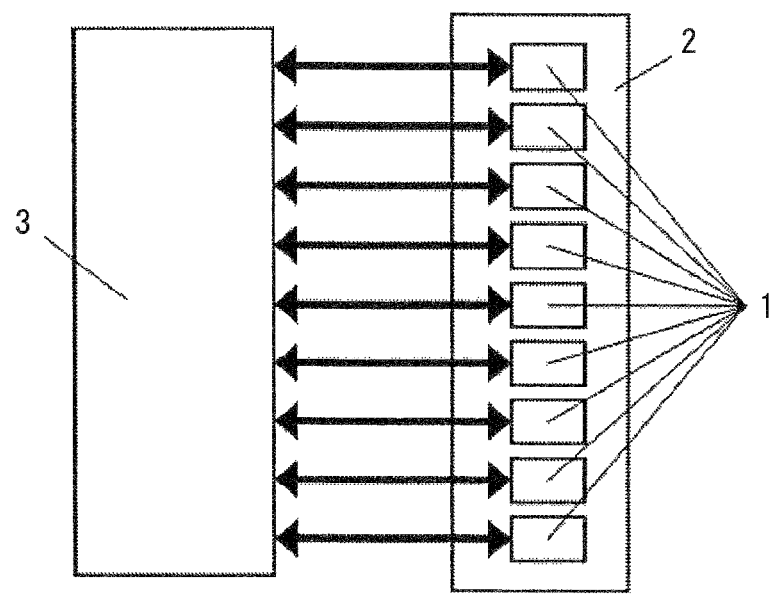
FIG. 9 is a schematic view of a memory system related to the present invention.

In a memory system using a memory module with error detecting/correcting function in FIG. 1, as in the memory system shown in FIG. 9 and related to the present invention, data is written in or read from a memory. However, the buffer 4, which detects and corrects a memory error can perform error detection and error correction on the memory module.

In FIG. 2, a signal driven by the memory device 1 is received by the driver receiver circuit 6 and transmitted to the error detecting/correcting circuit 7. The error detecting/correcting circuit 7 detects the presence/absence of an error. When the error detecting/correcting circuit 7 detects an error, the error detecting/correcting circuit 7 transmits the error information to the transmitting circuit 9. The transmitting circuit 9 transmits the error information to the nonvolatile storage area 5 (see FIG. 1).

The error detecting/correcting circuit 7 corrects data in occurrence of an error only when a High signal is transmitted from the error correction designating circuit 10, and the error detecting/correcting circuit 7 transmits the data to the driver receiver circuit 8. When a signal from the error correction designating circuit 10 is at Low, the data is transmitted to the driver receiver circuit 8 without being corrected. The driver receiver circuit 8 transmits the data received from the error detecting/correcting circuit 7 to a memory controller.

The error correction designating circuit 10 transmits a High signal to the error detecting/correcting circuit 7 when error correction is required. In order to determine whether the error correction designating circuit 10 designates error correction, information or a designation transmitted from the outside of the error correction designating circuit 10 is required. However, an explanation of the information or the designation is omitted here.

A signal driven by the memory controller 3 (see FIG. 1) is received by the driver receiver circuit 8 and directly transmitted to the driver receiver circuit 6. The driver receiver circuit 6 transmits the data received from the driver receiver circuit 8 to the memory device 1.

Second Exemplary Embodiment

A second exemplary embodiment of a memory module according to the present invention will be described below with reference to the accompanying drawings.

FIG. 7 is one example of a block diagram showing the second exemplary embodiment of the memory module according to the present invention.

The memory module shown in FIG. 7 is an example of a memory module with error detecting/correcting function obtained by dualizing a memory device.

Reference numeral 15 denotes a memory device A; 16 denotes a memory device B; 17 denotes a memory device selecting circuit; 18 denotes a buffer that detects and corrects a memory error; and 19 denotes a nonvolatile storage area to record a memory error. Reference symbol I is a signal to transmit an error to the memory device selecting circuit 17 in detection of an error.

More specifically, the memory module is a memory module including a plurality of memory devices A15 and a plurality of memory devices B16 arranged on the circuit board 2 and controlled by the external memory controller 3, including: the buffer 18 having a function of detecting and correcting an error; the nonvolatile storage area 19 that stores contents of the error; and L (L is a natural number of 2 or more) memory banks MB1, each configured by one pair of memory devices A15 and B16 and the memory device selecting circuit 17 that is connected to the one pair of memory devices A15 and B16, simultaneously transmits the same data to the one pair of memory devices A15 and B16, transmits data from one memory device (for example, the memory device A15) to the buffer 18 when an error does not occur during reading of the data, and switches the data to data from the other memory device (in this case, the memory device B16) when the error occurs.

In this memory module, a signal transmitted from the memory controller is input to the buffer 18 and directly transmitted to the memory device selecting circuit 17. The memory device selecting circuit 17 transmits the same data to the memory devices 15 and 16.

Signals driven by the memory devices 15 and 16 are transmitted to the memory device selecting circuit 17.

When no error occurs, the memory device selecting circuit 17 transmits data from the memory device A15 to the buffer 18. The buffer 18 performs error detection and error correction as in the buffer 4 shown in FIG. 1 and transmits the data to the memory controller 1 (see FIG. 1). When the buffer 18 detects an error, the signal I goes to High, and the memory device selecting circuit 17 switches data transmitted to the buffer 18 to data from the memory device B16 by the change of the signal I. The buffer 18 writes error information in the nonvolatile storage area 19 in detection of an error. This scheme can form a memory module with error detecting/correcting function obtained by dualizing the memory device A15 and the memory device B16 to realize a reliable system.

Although only one signal I is used in FIG. 7, the signal has a plurality of bits to make it possible to perform a switching operation in units of bits but in units of memory devices.

When the system must be notified of an error, erroneous data may be transmitted to the memory controller 3 (see FIG.

1), or error notification may be performed by using a bus except for a bus for data transmission.

Third Exemplary Embodiment

A third exemplary embodiment of a memory module according to the present invention will be described below with reference to the accompanying drawings.

Figure 8:
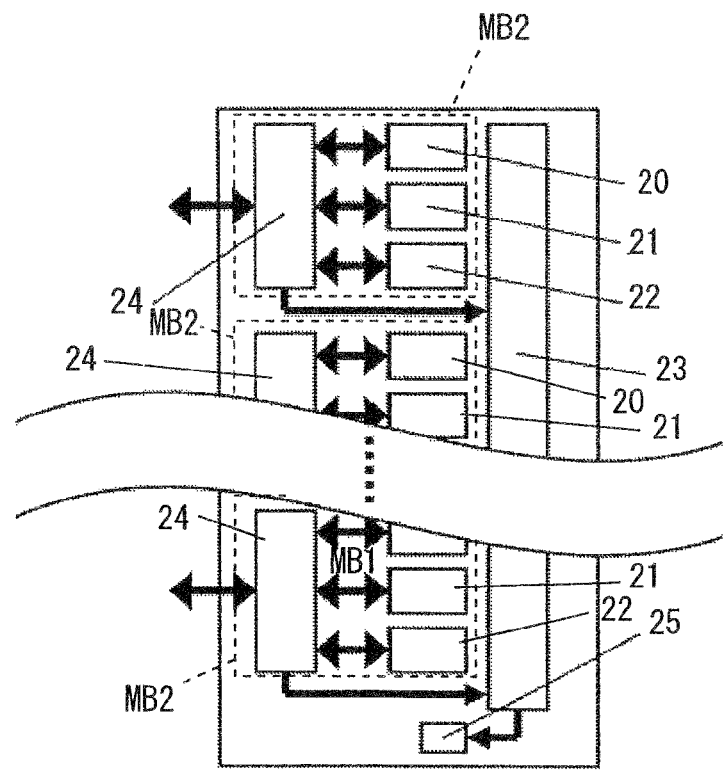
FIG. 8 is a block diagram showing a third exemplary embodiment of a memory module according to the present invention.

FIG. 8 is a block diagram showing the third exemplary embodiment of the memory module according to the present invention.

The memory module shown in FIG. 8 is one example of a memory module with error detecting/correcting function obtained by triplicating a memory device.

Reference numeral 20 denotes a memory device A; 21 denotes a memory device B; 22 denotes a memory device C; 23 denotes an error receiving buffer; 24 denotes a triplicating buffer; and 25 denotes a nonvolatile storage area in which a memory error is recorded.

More specifically, this memory module is a memory module including a plurality of memory devices A20, B21, and C22 arranged on the circuit board 2 and controlled by the external memory controller 1 (see FIG. 1), including: M (M is a natural number of 2 or more) memory banks MB2 each configured by the N (N is a natural number of 3 or more, in the exemplary embodiment N is 3) memory device A20, the memory device B21, and the memory device C22 and an N-multiplexed (in this case, triple) buffer that is connected to the external memory controller 1 (see FIG. 1), simultaneously transmits the same data to the N (in this case, N is 3) memory device A20, the memory device B21, and the memory device C22, and performs a majority decision in units of bits during reading of the data to transmit a major value to the memory controller 1 (see FIG. 1); the error receiving buffer 23 that receives error position information transmitted from the memory bank MB2 when the memory bank MB2 has a difference between the data; and the nonvolatile storage area 25 that is connected to the error receiving buffer 23 and stores contents of the error.

In this memory module, a signal transmitted from the memory controller is input to the triplicating buffer 24, and the triplicating buffer 24 transmits the same data to all the memory device A20, the memory device B21, and the memory device C22. When data is transmitted from the memory device, the triplicating buffer 24 receives data from the memory device A20, the memory device B21, and the memory device C22 and performs a majority decision in units of bits to transmit a major value to the memory controller. When the values of the memory device A20, the memory device B21, and the memory device C22 have a difference, the triplicating buffer 24 transmits error position information to the error receiving buffer 23. The error receiving buffer 23 transmits the error information to the nonvolatile storage area 25, and the nonvolatile storage area 25 stores the error information. This scheme can form a memory module with error detecting/correcting function obtained by triplicating a memory device, and a system having reliability higher than that of a memory module with error detecting/correcting function obtained by dualizing a memory device is realized.

When the system must be notified of an error, erroneous data may be transmitted to the memory controller, or error notification may be performed by using a bus except for a bus for data transmission.

In this case, the drawings to explain the exemplary embodiments described above are simplified, and the number of interfaces and connection contents need not be the same as those in the drawings. For example, although the memory controller and the memory module have a one-to-one correspondence, the present invention is not limited to the one-to-one correspondence. A one-to-many correspondence may be used.

Furthermore, the circuits shown in FIGS. 2, 4, and 6 are only examples. The present invention is not limited to the circuits. Other circuits which can realize the same functions as described above may be used.

In the drawings of the exemplary embodiments, although a signal between a memory controller and a memory module is parallel transmission, the present invention is not limited to the parallel transmission, and serial transmission may be used.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

EFFECT OF THE INVENTION

In an information processing apparatus using a memory module, an error in the memory module can be detected and recorded by the memory module itself. Error correction can be performed by the memory module. As a result, positions where errors occur can be easily classified. By giving an error correcting function to a memory module, reinforcement of the error correcting function or improvement of reliability can be realized on the memory module without using the error correcting function on the memory controller.

[Comparison between this Application and Patent Documents 1 to 4]

<Patent Document 1>

The invention described in Patent Document 1 is related to a microcomputer using a flash memory with error detecting/correcting function, and is completely different from the application in configuration and functional effect.

<Patent Document 2>

The invention described in Patent Document 2 is related to a memory device using another address in error correction, and is different from the application in error correcting method.

<Patent Document 3>

The invention described in Patent Document 3 is an invention to reduce a memory capacity of an EEPROM, and is completely different from the application in configuration and functional effect.

<Patent Document 4>

The invention described in Patent Document 4 looks similar to the application with respect to a dual memory. However, the invention is different from the application in that an error detecting circuit is arranged in a memory chip.

Therefore, the present application is completely different from the inventions described in Patent Documents 1 to 4 in configuration and functional effect.

What is claimed is:

1. A memory module comprising a plurality of memory devices arranged on a circuit board and controlled by an external memory controller, comprising:
   a buffer having a function of detecting and correcting an error; and
   a nonvolatile storage area that stores contents of the error,
   wherein the buffer includes a memory-controller-side driver receiver circuit that exchanges a signal with the memory controller;

a memory-device-side driver receiver circuit that exchanges a signal with the memory device;

an error detecting/correcting circuit that is connected to the memory-controller-side driver receiver circuit and the memory-device-side driver receiver circuit and detects and corrects an error; and an error correction designating circuit that designates the error detecting/correcting circuit to perform error detection.

2. A memory module comprising a plurality of memory devices arranged on a circuit board and controlled by an external memory controller, comprising:

a buffer having a function of detecting and correcting an error;

a nonvolatile storage area that stores contents of the error; and

L memory banks (L is a natural number of 2 or more), each comprising one pair of memory devices and a memory device selecting circuit that is connected to the one pair of memory devices, simultaneously transmits the same data to the one pair of memory devices, transmits data from one memory device to the buffer when an error does not occur during reading of the data, and switches the data to data from the other memory device when the error occurs.

3. A memory module comprising a plurality of memory devices arranged on a circuit board and controlled by an external memory controller, comprising:

M (M is a natural number of 2 or more) memory banks, each comprising N (N is a natural number of 3 or more) memory devices and an N-multiplexed buffer that is connected to an external memory controller, simultaneously transmits the same data to the N memory devices, and performs a majority decision in units of bits during reading of the data to transmit a major value to the memory controller;

an error receiving buffer that receives error position information transmitted from the memory bank when the memory bank has a difference between the data; and a nonvolatile storage area that is connected to the error receiving buffer and stores contents of the error.

4. The memory module according to claim 2, wherein the buffer includes a memory-controller-side driver receiver circuit that exchanges a signal with the memory controller;

a memory-device-side driver receiver circuit that exchanges a signal with the memory device;

an error detecting/correcting circuit that is connected to the memory-controller-side driver receiver circuit and the memory-device-side driver receiver circuit and detects and corrects an error; and an error correction designating circuit that designates the error detecting/correcting circuit to perform error detection.

5. The memory module according to claim 3, wherein the buffer includes a memory-controller-side driver receiver circuit that exchanges a signal with the memory controller;

a memory-device-side driver receiver circuit that exchanges a signal with the memory device;

an error detecting/correcting circuit that is connected to the memory-controller-side driver receiver circuit and the memory-device-side driver receiver circuit and detects and corrects an error; and an error correction designating circuit that designates the error detecting/correcting circuit to perform error detection.

6. The memory module according to claim 1, wherein the error detecting/correcting circuit includes an error detecting circuit;

an error correcting switch comprising an input terminal connected to an output terminal of the error detecting circuit; and an error correcting circuit comprising an input terminal connected to an output terminal of the error correcting switch and configured by a plurality of 2-input exclusive OR gates.

7. The memory module according to claim 5, wherein the error detecting/correcting circuit includes an error detecting circuit;

an error correcting switch comprising an input terminal connected to an output terminal of the error detecting circuit; and an error correcting circuit comprising an input terminal connected to an output terminal of the error correcting switch and configured by a plurality of 2-input exclusive OR gates.

8. The memory module according to claim 6, wherein the error detecting/correcting circuit includes an error detecting circuit;

an error correcting switch comprising an input terminal connected to an output terminal of the error detecting circuit; and an error correcting circuit comprising an input terminal connected to an output terminal of the error correcting switch and configured by a plurality of 2-input exclusive OR gates.

9. The memory module according to claim 7, wherein the error correcting switch includes a plurality of sets of cells, each configured by a plurality of 2-input AND gates that includes one input terminals connected to a common terminal, the other input terminals connected to a first input terminal, and an output terminal connected to a first output terminal; and a jumper line that connects a second input terminal and a second output terminal to each other.

10. The memory module according to claim 7, wherein the error correcting switch includes a plurality of sets of cells, each configured by a plurality of 2-input AND gates that includes one input terminals connected to a common terminal, the other input terminals connected to a first input terminal, and an output terminal connected to a first output terminal; and a jumper line that connects a second input terminal and a second output terminal to each other.

11. The memory module according to claim 8, wherein the error correcting switch includes a plurality of sets of cells, each configured by a plurality of 2-input AND gates that includes one input terminals connected to a common terminal, the other input terminals connected to a first input terminal, and an output terminal connected to a first output terminal; and a jumper line that connects a second input terminal and a second output terminal to each other.

* * * * *